US008847652B2

(12) United States Patent
Chern et al.

(10) Patent No.: US 8,847,652 B2
(45) Date of Patent: Sep. 30, 2014

(54) RECONFIGURABLE AND AUTO-RECONFIGURABLE RESONANT CLOCK

(75) Inventors: Chan-Hong Chern, Palo Alto, CA (US); Tao Wen Chung, San Jose, CA (US); Chih-Chang Lin, San Jose, CA (US); Ming-Chieh Huang, San Jose, CA (US); Tsung-Ching Huang, San Jose, CA (US); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 54 days.

(21) Appl. No.: 13/558,670

(22) Filed: Jul. 26, 2012

(65) Prior Publication Data
US 2014/0028407 A1 Jan. 30, 2014

(51) Int. Cl.
*G06F 1/10* (2006.01)
*H03K 5/15* (2006.01)

(52) U.S. Cl.
CPC ...... *G06F 1/10* (2013.01); *H03K 5/15* (2013.01)
USPC ........... 327/291; 327/108; 327/110; 327/304; 713/500

(58) Field of Classification Search
CPC .............. G06F 1/10; H03K 5/05; H03K 5/15; H03K 5/1565; H03B 5/1268; H03B 5/1256; H03B 2201/0216
USPC ........ 331/117 R, 117 FE, 167, 117 D, 74, 77; 327/291, 295, 293, 297, 304, 108, 110; 713/500
See application file for complete search history.

(56) References Cited

U.S. PATENT DOCUMENTS

| 6,882,182 B1* | 4/2005 | Conn et al. ............. 326/93 |
| 7,082,580 B2* | 7/2006 | Zarkesh-Ha et al. ....... 716/138 |
| 2011/0090018 A1* | 4/2011 | Papaefthymiou et al. .... 331/117 FE |
| 2011/0140753 A1* | 6/2011 | Papaefthymiou et al. .... 327/291 |

OTHER PUBLICATIONS

Chueh et al.,. "900MHz to 1.2 GHz two-phase resonant clock network with programmable driver and loading." Custom Integrated Circuits Conference, 2006. CICC'06. IEEE. IEEE, 2006.*
Palmer et al., "A 14 mW 6.25Gb/s Transceiver in 90nm CMOS for Serial Chip-to-Chip Communications", Solid-State Circuits Conference, 2007. ISSCC 2007. Digest of Technical Papers. IEEE International. IEEE, 2007.*
S. C. Chan, et al.; "Uniform-Phase Uniform-Amplitude Resonant-Load Global Clock Distributions.", IEEE Journal of Solid-State Circuits, vol. 40, No. 1, Jan. 2005, p. 102-109.

* cited by examiner

*Primary Examiner* — Ryan Johnson
(74) *Attorney, Agent, or Firm* — Eschweiler & Associates, LLC

(57) ABSTRACT

The present disclosure relates to a resonant clock system having a driver component, a clock load capacitor, and a reconfigurable inductor array. The driver component generates a driven input signal. The clock load capacitor is configured to receive the driven input signal. The inductor array is configured to have an effective inductance according to a selected frequency. The inductor array also generates a resonant signal at the selected frequency using the effective inductance.

17 Claims, 10 Drawing Sheets

RECONFIGURABLE AND AUTO-RECONFIGURABLE RESONANT CLOCK

BACKGROUND

A clock generator is a circuit that produces a clock signal that can be used for a variety of purposes, including synchronizing a circuit's operation. The clock signal can be in the form of a sine wave, square wave, and the like. A clock circuit generally includes a resonant circuit and an amplifier circuit.

The resonant circuit can include an oscillator, such as a quartz piezo-electric oscillator, LC tank circuits, and ring oscillator circuits. The amplifier circuit typically inverts the oscillator signal and feeds a portion back as feedback in order to maintain oscillation.

The clock generator generates the clock signal having a variety of characteristics. These include duty cycle, waveform shape, min/max values, stability, and the like.

DETAILED DESCRIPTION

Figure 1:
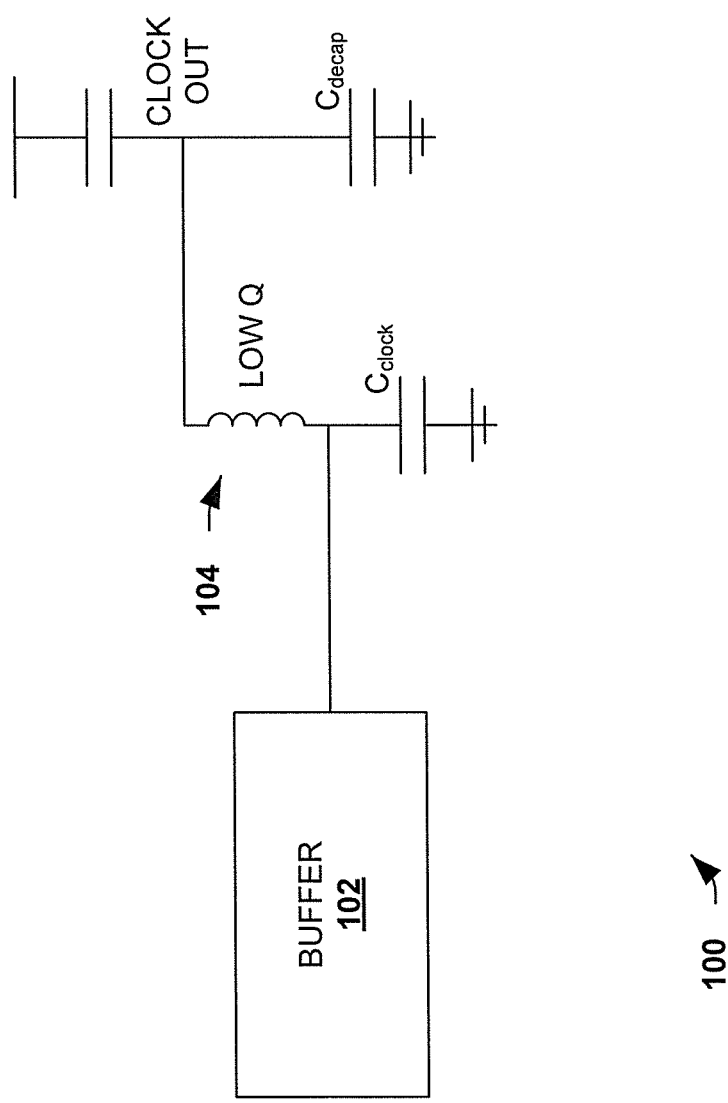
FIG. 1 is a diagram of a resonant clock circuit.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

This disclosure includes methods and systems for resonant clocks that facilitate power saving efficiency and mitigate clock timing uncertainty across various operating frequencies.

Resonant clock circuits include an LC tank that resonates at a particular frequency. The resonance effect occurs when the inductive reactance and the capacitive reactance are equal in absolute value. However, at non-resonant frequencies, performance is typically degraded.

Resonant clock circuits utilize a resonant clocking technique to resonate a large global clock capacitance load with an inductor. The energy used to charge the clock in each period can be recycled within an LC tank such that chip power dissipation can be mitigated. It is appreciated that inductive reactance can be utilized to cancel or mitigate capacitive reactance around a resonant frequency. The cancellation feature of capacitive reactance by inductive reactance is utilized by resonant clock circuits to reduce clock power consumption and timing uncertainty, due to skew and jitter.

Generally, power consumption or dissipation for a clock circuit in a chip is linearly proportional to a chip clock operating frequency. Thus, if the frequency goes up, the power consumption increases. The frequency lowers, the power consumption lowers.

Another factor related to power consumption of resonant clock circuits is the quality of the inductor used. The quality factor (or Q) of an inductor is the ratio of its inductive reactance to its resistance at a given frequency, and is a measure of its efficiency. The higher the Q factor of the inductor is, the closer it approaches the behavior of an ideal, lossless, inductor. Thus, an inductor L in an LC tank is typically chosen with a high Q value and operates at a resonance frequency in order to mitigate power consumption.

However, resonant clock circuits are utilized for more than one frequency. Thus, use at non resonant frequencies results in increased power consumption at least partially due to significantly low Q values for the inductor at the non resonant frequencies and the clock network sees significant clock (capacitance) load.

One technique to mitigate this increased power consumption is to select a Q factor for an inductor that is somewhat lower at the resonant frequency. As a result, the Q factor for non resonant frequencies can be higher. Thus some power consumption at non-resonant frequencies can be mitigated.

FIG. 1 is a diagram of a resonant clock circuit 100. The clock circuit 100 is provided as an example and is operable to provide an output signal or output clock (CLOCK OUT) signal at multiple frequencies, including a resonant frequency.

The clock circuit 100 includes a buffer or driver 102 and an inductor 104. The circuit 100 also includes a first capacitor ($C_{clock}$) and a second capacitor ($C_{decap}$). The second capacitor typically has a value of about 10× of the first capacitor. The buffer 102 receives an input signal and provides a driven signal to a first terminal of the inductor 104. The inductor 104 is selected to have a low Q factor at a resonant frequency such that the inductor 104 has Q factor values above a threshold value at one or more selected non-resonant frequencies.

Figure 2:
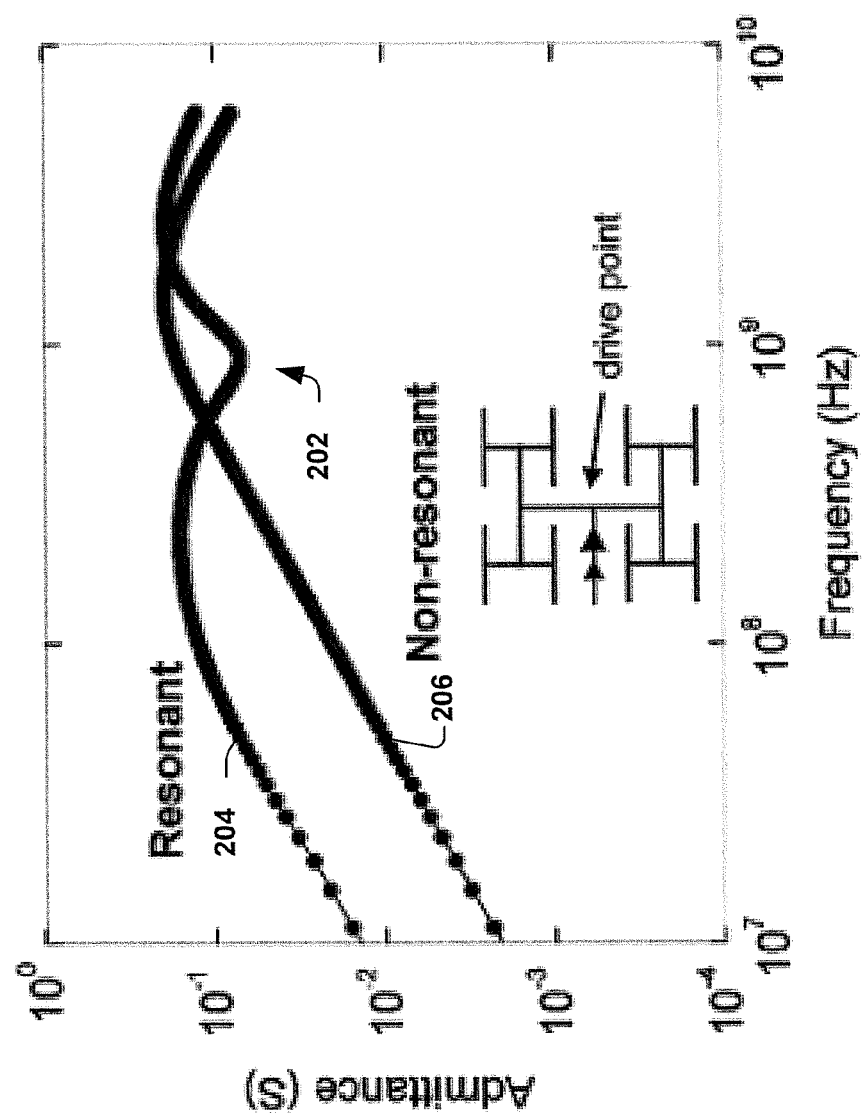
FIG. 2 is a graph illustrating driving point admittance for resonant and non-resonant clock frequencies for the clock circuit 100 of FIG. 1.

FIG. 2 is a graph 200 illustrating driving point admittance for resonant and non-resonant clock networks versus clock frequencies for the clock circuit 100 of FIG. 1. The graph 200 depicts frequency along an x-axis and admittance seen by the clock buffer 102 at the node between the inductor 104 and $C_{clock}$ along a y-axis. A first line 204 depicts admittance v. frequency for a resonant sector, or a resonant focused clock circuit. A second line 206 depicts admittance v. frequency for a non-resonant sector.

As a result, a bump or depression is shown at 202 wherein there is a decrease in admittance. At non-resonant frequencies, a low-Q resonant clock results in certain amount of Q factor which lowers certain amount of admittance to help reduce some power consumption.

Although the resonant circuit 100 mitigates power consumption at non-resonant frequencies; it still results in increased power consumption compared with similar resonant clock circuits that utilize high Q factor inductors at a resonant frequency.

Figure 3:
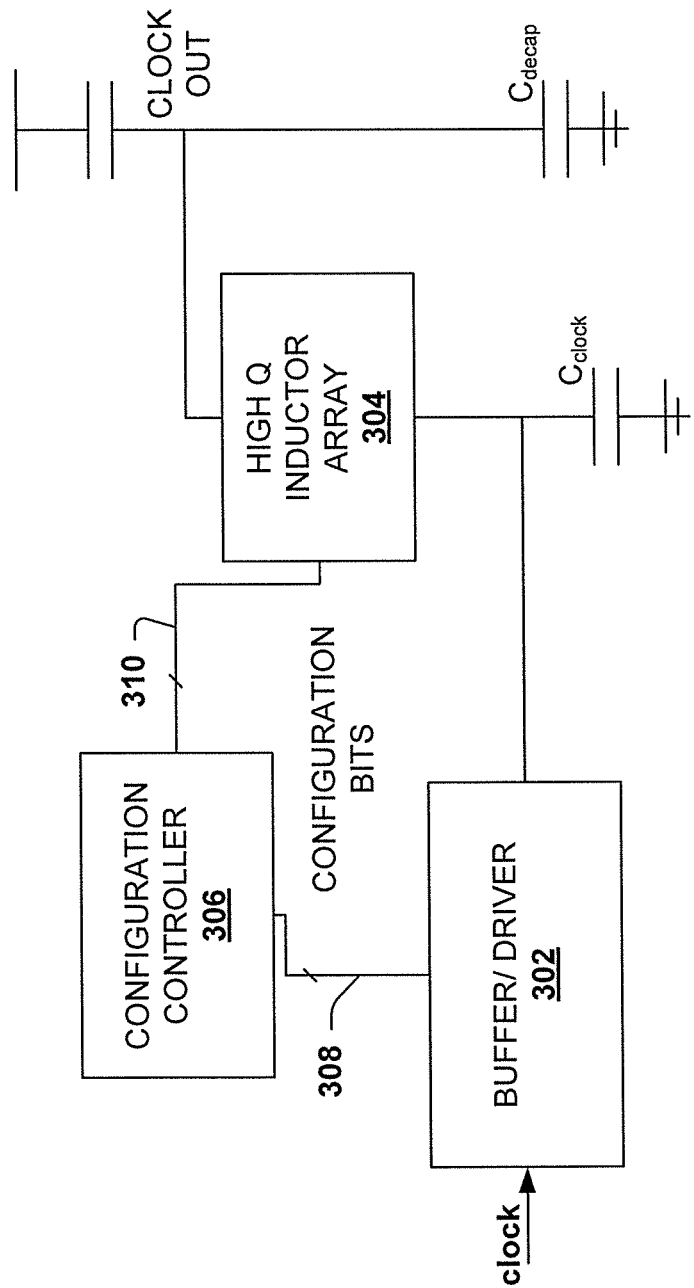
FIG. 3 is a block diagram illustrating a resonant clock circuit system in accordance with this disclosure.

FIG. 3 is a block diagram illustrating a resonant clock circuit system 300 in accordance with this disclosure. The system 300 utilizes an array of inductors such that an inductance value is selectable. The system 300 is also referred to as a reconfigurable resonant clock mesh scheme.

The resonant clock system 300 includes a buffer/driver 302, a high Q factor inductor array 304, and a configuration controller 306. The driver component 302 includes a plurality of drivers having varied sizes. The driver component 302 selects one of the plurality of drivers for use according to configuration bits 308 associated with a current, selected frequency. Generally, a larger driver is used for higher frequencies because power needed is proportional to the frequency. However, larger drivers consume more power than smaller drivers. Thus, using a larger driver for lower frequencies results in increased and/or unnecessary power consumption. Thus, the driver component 302 generally selects smaller drivers for lower frequencies and larger drivers for higher frequencies in order to mitigate power consumption and provide an appropriately sized driver of the plurality of drivers. The driver component 302 receives an input signal, such as a PLL signal, and generates a driven signal there from using the selected driver of the plurality of drivers.

The inductor array 304 includes an array of selectable high Q factor inductors. The inductor array 304 provides a selected high Q inductance according to inductor configuration bits 310. The possible or potential inductance values correspond to selectable frequencies for the system 300. The configuration bits 310 specify a selectable inductance value corresponding to the current, selected frequency.

The inductor array 304 receives the inductor configuration bits 310 and the driven signal and provides a oscillating signal at the selected frequency. The inductor array 304 includes in array of selectable inductors aligned in serial and/or parallel configurations. Each of the inductors includes a switch to remove or include the inductor to provide the selected inductance value. The number of inductors in effect is selected through the switches by the inductor configuration bits. In one example, the switches include MOS switches and/or phase change switches. For example, in one example, 3 inductors are included to provide an example selected inductance value. The total amount of inductance provided by the inductor array 304 and $C_{clock}$ result in an LC tank oscillation frequency that corresponds to the selected frequency.

The configuration controller 306 provides the inductor configuration bits 310 and the driver configuration bits 308 according to the current, selected frequency. In one example, the selected frequency is provided. In another example, the selected frequency is identified using a suitable mechanism, such as a frequency comparator. Thus, the configuration controller 306 generates the inductor configuration bits 310 and the driver configuration bits 308 according to the current, selected frequency.

By utilizing the inductor array 304, high Q factor effective inductors are provided for the plurality of selectable frequencies. Thus, the selectable frequencies utilize high Q factor effective inductors, which results in lower power consumption and mitigates timing discrepancies, such as slew and jitter.

Figure 4:
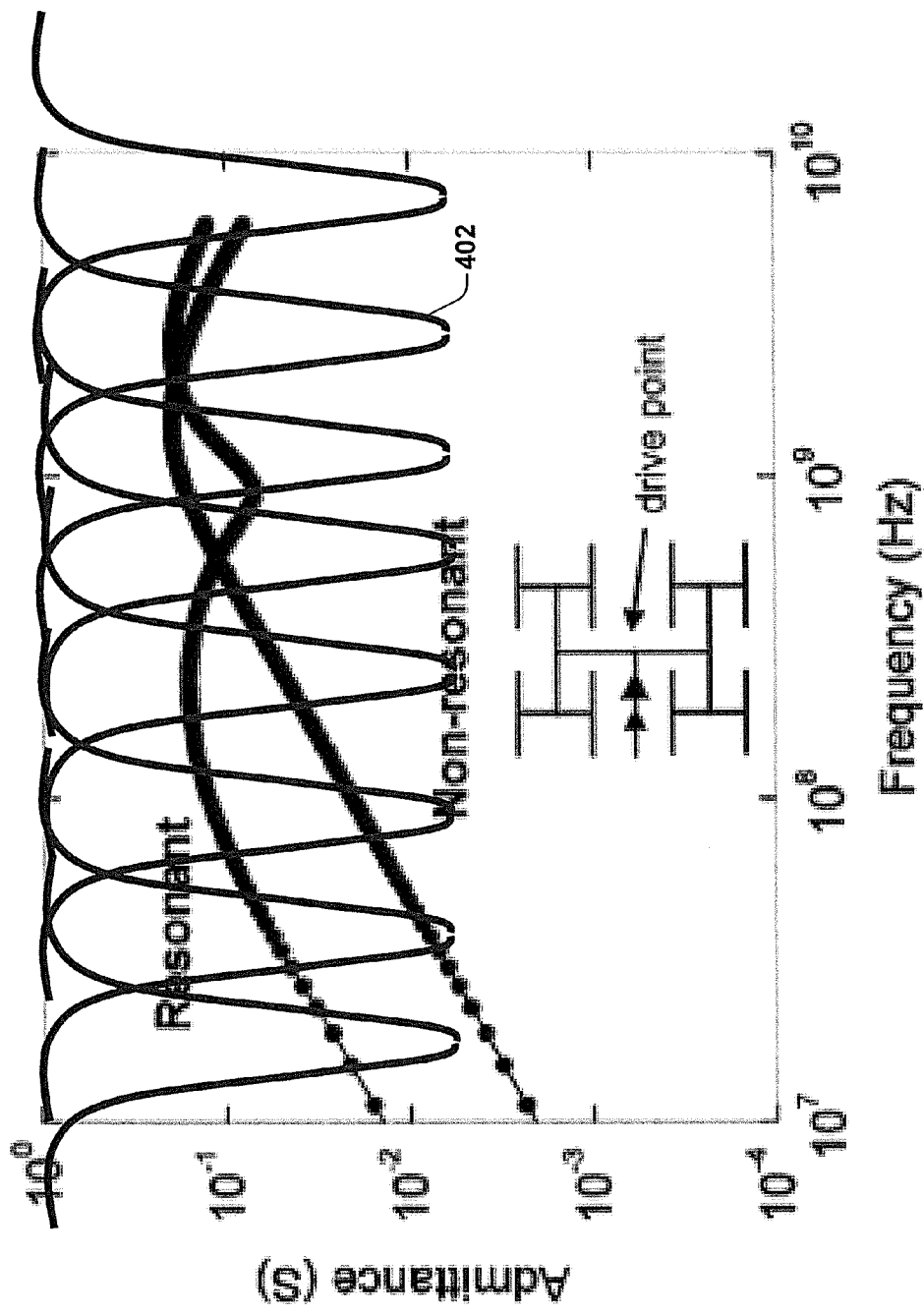
FIG. 4 is a graph illustrating driving point admittance for a reconfigurable resonant clock mesh scheme in accordance with the present disclosure.

FIG. 4 is a graph 400 illustrating driving point admittance for a reconfigurable resonant clock mesh scheme in accordance with the present disclosure. An example of such a scheme is the resonant clock system 300 of FIG. 3.

The graph 400 depicts frequency along an x-axis and admittance along a y-axis. Resonant and non-resonant response lines are shown. Lines 402 depict selectable admittance values seen by the clock buffer/driver 302 from a selectable inductor array, such as the inductor array 304.

It can be seen that by selecting inductance values according to selected frequencies, lower admittance values are obtained at each selected frequency. As a result, the resonant clock circuit can provide the multiple, selected frequencies with lowered power consumption.

Figure 5:
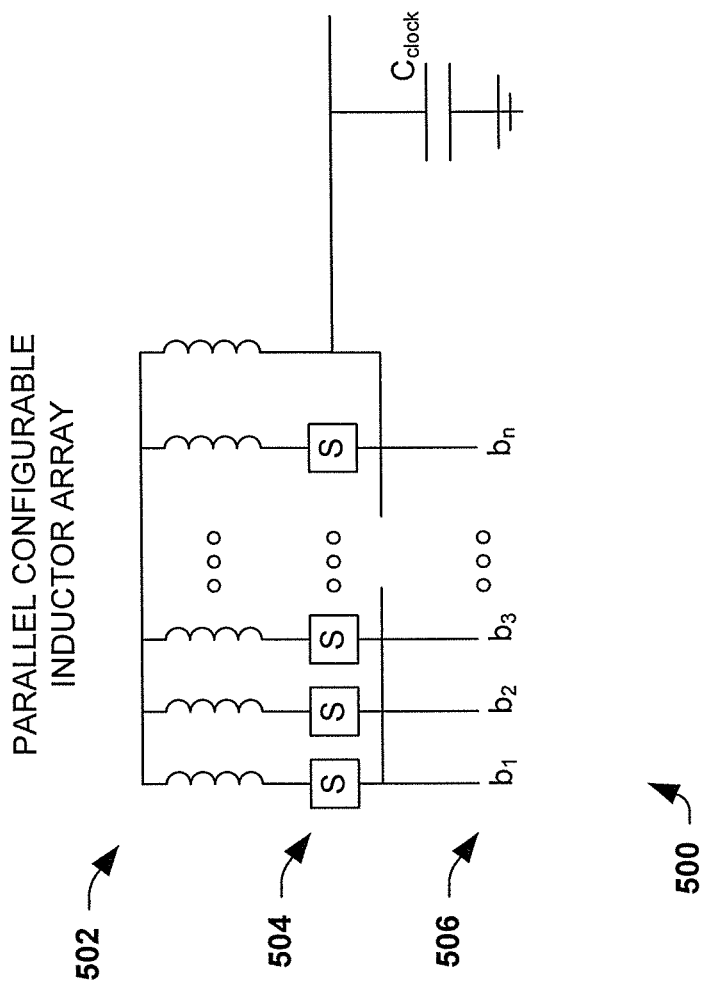
FIG. 5 is a diagram illustrating a parallel configuration for a configurable inductor array in accordance with the present disclosure.

As stated above, a variety of suitable inductor configurations can be utilized. FIG. 5 is a diagram illustrating a parallel configuration for a configurable inductor array 500 in accordance with the present disclosure. The inductor array 500 can be utilized, for example, as the inductor array 304 in the resonant clock system 300 of FIG. 3.

Here, the array 500 includes a plurality of high Q factor inductors 502 and a plurality of switches 504. The plurality of inductors 502 have high Q factors. In one example, the plurality of inductors 502 each has the same inductance value. In another example, the plurality of inductors 502 each has varied inductance values.

The plurality of switches 504 correspond to the inductors 502, such that a switch is present for each inductor. The switches 504, in one example, are MOS switches or phase change switches. The switches 504 operate to selectively remove or include the respective inductors from a total inductance for the array 500.

The switches 504 are controlled by a series of inductor configuration bits 506 ($b_1, b_2, \ldots b_n$). The bit values operate the switches 504 to close or open, thereby adding the associated inductor to or removing the associated inductor from the effective inductor and adding or removing the associated inductance value to or from the total inductance for the array. The total inductance for the array 500 is equal to the reciprocal of the sum of the reciprocal inductances of the inductors that are included in the array by the switched 504.

Figure 6:
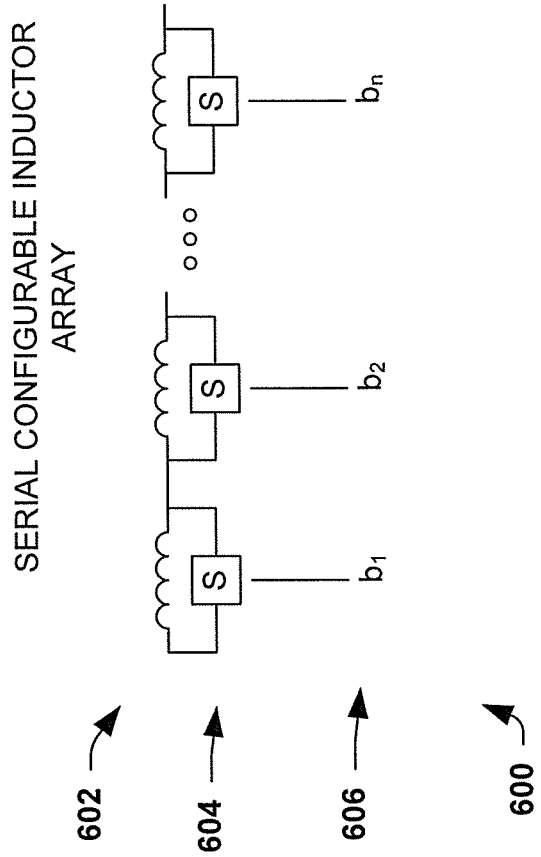
FIG. 6 is a diagram illustrating a serial configuration for a configurable inductor array in accordance with the present disclosure.

FIG. 6 is a diagram illustrating a serial configuration for a configurable inductor array 600 in accordance with the present disclosure. The inductor array 600 can be utilized, for example, as the inductor array 304 in the resonant clock system 300 of FIG. 3.

Here, the array 600 includes a plurality of high Q factor inductors 602 and a plurality of switches 604. The plurality of inductors 602 have high Q factors and are connected in serial. In one example, the plurality of inductors 602 each has the same inductance value. In another example, the plurality of inductors 602 each has varied inductance values.

The plurality of switches 604 correspond to the inductors 602, such that a switch is present for each inductor. The switches 604, in one example, are MOS switches or phase change switches. The switches 604 operate to selectively remove or include the respective inductors from a total inductance for the array 600. Thus, their individual inductances are added or removed from the total inductance of the array 600.

The switches 604 are controlled by a series of inductor configuration bits 606 ($b_1, b_2, \ldots b_n$). The bit values operate the switches 604 to close or open. Here, a closed switch bypasses or excludes the associated inductor from the total inductance of the array. In contrast, an open switch adds the associated inductor to the effective total inductor.

It is appreciated that other configurations are suitable with inductors in an inductor array. For example, a combination of serial connected inductors and parallel connected inductors can also be utilized.

Figure 7A:
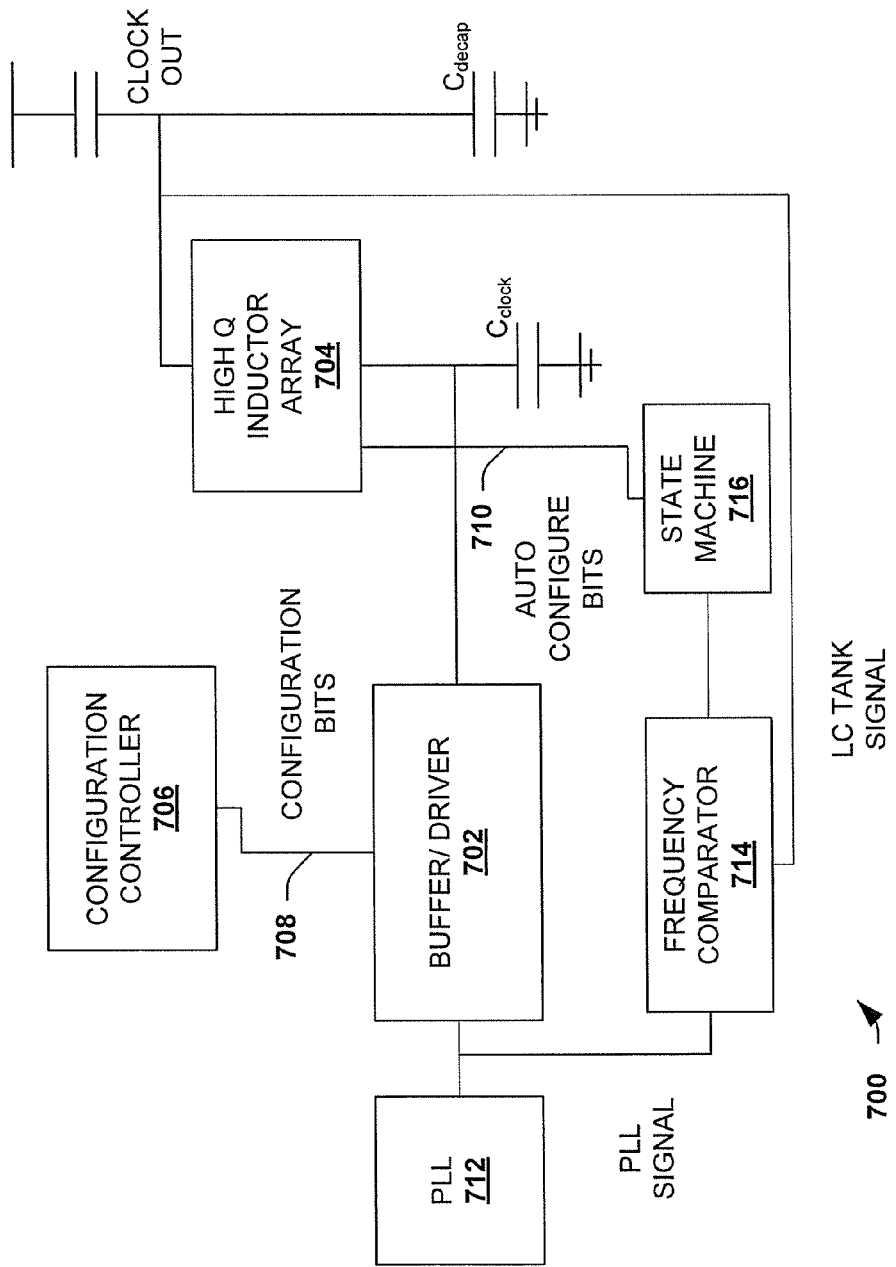
FIG. 7A is a block diagram illustrating a resonant clock circuit system architecture in accordance with this disclosure.

FIG. 7A is a block diagram illustrating a resonant clock circuit system 700 in accordance with this disclosure. The system 700 utilizes an array of inductors such that an effective inductance is selectable and is also referred to as a reconfigurable resonant clock mesh scheme. The system 700 compares two signals, one from the LC resonant tank, composed of an inductor array 704 and a clock load, $C_{clock}$ and the other from a PLL 712 to automatically check for variations in frequency. When variations are detected, inductor configuration bits are automatically adjusted according to the identified variations.

The resonant clock system 700 includes components similar to those used in the system 300 described above. The corresponding description for the similar named components of system 300 can be referenced for the system 700.

The resonant clock system 700 includes a buffer/driver 702, a high Q factor inductor array 704, a configuration controller 706, a phase locked loop (PLL) 712, a frequency comparator 714 and a state machine 716. The driver component 702 includes a plurality of drivers having varied sizes. The driver component 702 selects one of the plurality of drivers for use according to configuration bits 708 associated with a current, selected frequency. Thus, the driver component 702 generally selects smaller drivers for lower frequencies and larger drivers for higher frequencies in order to mitigate power consumption and provide an appropriately sized driver of the plurality of drivers. The driver component 702 receives an input signal, a PLL signal, and generates a driven signal there from using the selected driver of the plurality of drivers.

The inductor array 704 includes an array of selectable high Q factor inductors. The inductor array 704 provides a selected high Q inductance according to inductor configuration bits 710. The possible or potential inductance values correspond to selectable frequencies for the system 700. The auto configuration bits specify a selectable inductance value corresponding to the current, selected frequency.

The inductor array 704 receives the auto configuration bits and resonant with the clock load, $C_{clock}$ to provide a resonant clock output signal, also referred to as an LC tank signal, at the selected frequency. The inductor array 704 includes in array of selectable inductors aligned in serial and/or parallel configurations. The total amount of inductance provided by the inductor array 704 results in an LC tank oscillation frequency that corresponds to the selected frequency.

The configuration controller 706 provides the driver configuration bits 708 to the driver component 702. In one example, the configuration controller 706 generates the driver configuration bits 708 according to the current, selected frequency.

The frequency comparator receives the PLL signal and the LC tank signal and generates a frequency deviation signal there from. The frequency deviation signal indicates the direction of frequency variation and/or an amount of deviation between the PLL signal and the LC tank signal.

The state machine 716 receives the frequency deviation signal and provides the auto configure bits/signal to the inductor array 704. The state machine 716 has a plurality of states associated with selectable frequencies of the system 700. The state machine 716 selects one of the states according to the frequency deviation signal and provides the auto configuration bits associated with the selected state.

As a result, the system 700 can adjust or compensate the inductance value of the array 704 automatically. Thus, the resonant clock signal frequency produced by the inductance value from the high-Q inductor array and the clock load $C_{clock}$ will be identical to the PLL signal frequency in the system 700.

Figure 7B:
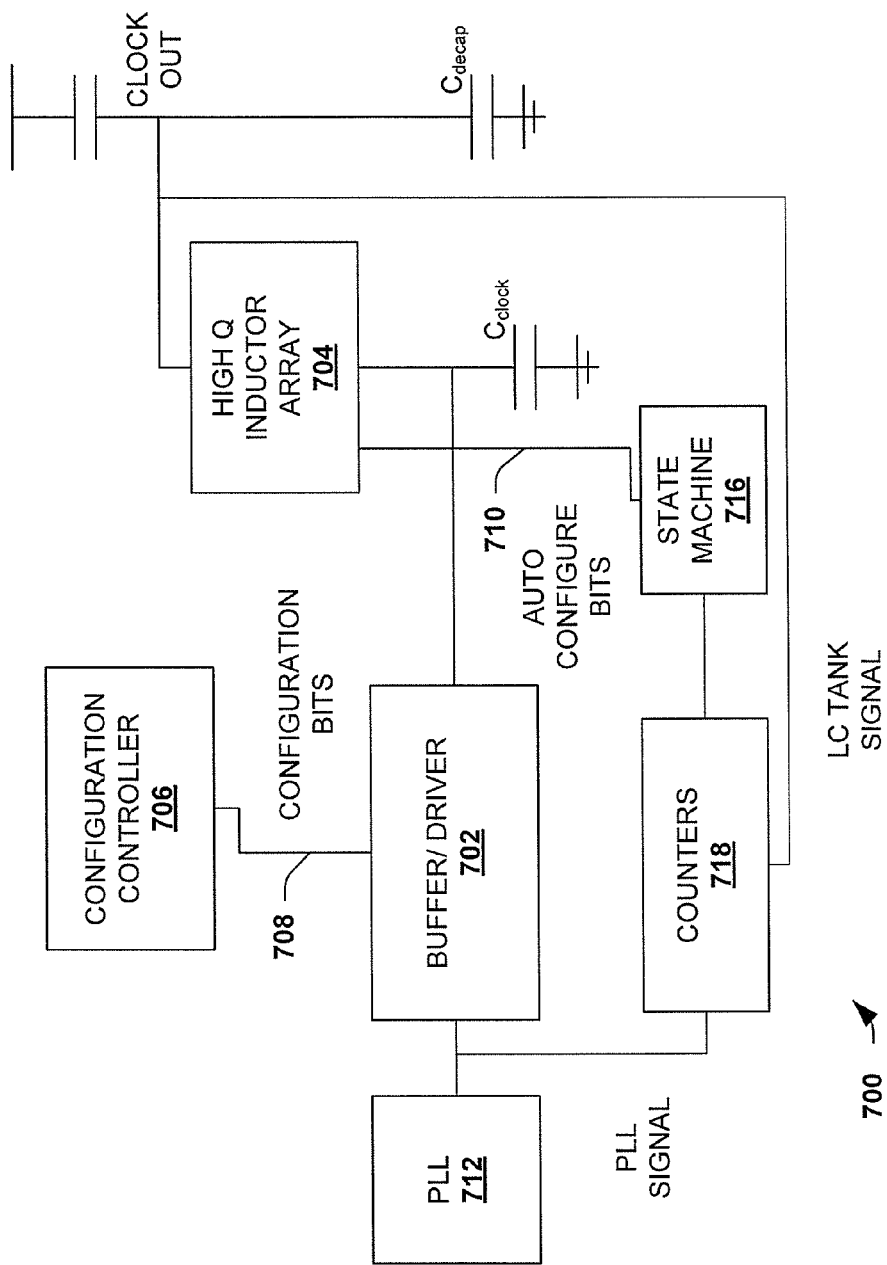
FIG. 7B is a block diagram illustrating a resonant clock circuit system implementation example in accordance with this disclosure.

FIG. 7B is a block diagram illustrating a resonant clock circuit system 700 in accordance with this disclosure. The system 700 utilizes an array of inductors such that an effective inductance is selectable and is also referred to as a reconfigurable resonant clock mesh scheme. The system 700 utilizes counters to compare two signals, one from the LC resonant tank, composed of an inductor array 704 and a clock load, $C_{clock}$ and the other from a PLL 712 to automatically check for variations in frequency. When variations are detected, inductor configuration bits are automatically adjusted according to the identified variations.

The resonant clock system 700 includes components similar to those used in the system 300 described above and in FIG. 7A. The corresponding description for the similar named components can be referenced.

The resonant clock system 700 includes a buffer/driver 702, a high Q factor inductor array 704, a configuration controller 706, a phase locked loop (PLL) 712, a counter component 718 and a state machine 716. The driver component 702 includes a plurality of drivers having varied sizes. The driver component 702 selects one of the plurality of drivers for use according to configuration bits 708 associated with a current, selected frequency. The driver component 702 receives an input signal, a PLL signal, and generates a driven signal there from using the selected driver of the plurality of drivers.

The inductor array 704 includes an array of selectable high Q factor inductors. The inductor array 704 provides a selected high Q inductance according to inductor configuration bits 710.

The inductor array 704 receives the auto configuration bits and the driven signal and provides a resonant clock output signal, also referred to as an LC tank signal, at the selected frequency. The inductor array 704 includes in array of selectable inductors aligned in serial and/or parallel configurations. The total amount of inductance provided by the inductor array 704 results in an LC tank oscillation frequency that corresponds to the selected frequency.

The configuration controller 706 provides the driver configuration bits 708 to the driver component 702. In one example, the configuration controller 706 generates the driver configuration bits 708 according to the current, selected frequency.

The counter component receives the PLL signal and the LC tank signal and generates a PLL count signal and a tank count signal, respectively. The PLL count signal counts transitions of the PLL signal and the tank count signal counts transitions of the LC tank signal. In one example, the counter component includes separate counters for the PLL signal and the LC tank signal that count transitions. The counters reset after a period of time, in one example.

The state machine 716 receives the PLL count signal and the tank count signal and provides the auto configure bits/signal to the inductor array 704. The state machine 716 has a plurality of states associated with the count difference of the tank count signal form the PLL count signal. The state machine 716 selects one of the states according to the tank counts signal and the PLL count signal and provides the auto configuration bits associated with the selected state.

As a result, the system 700 can adjust or compensate the inductance value of the array 704 automatically. Thus, the resonant clock signal frequency produced by the inductance value from the high-Q inductor array and the clock load $C_{clock}$ will be identical to the PLL signal frequency in the system 700.

Figure 7C:
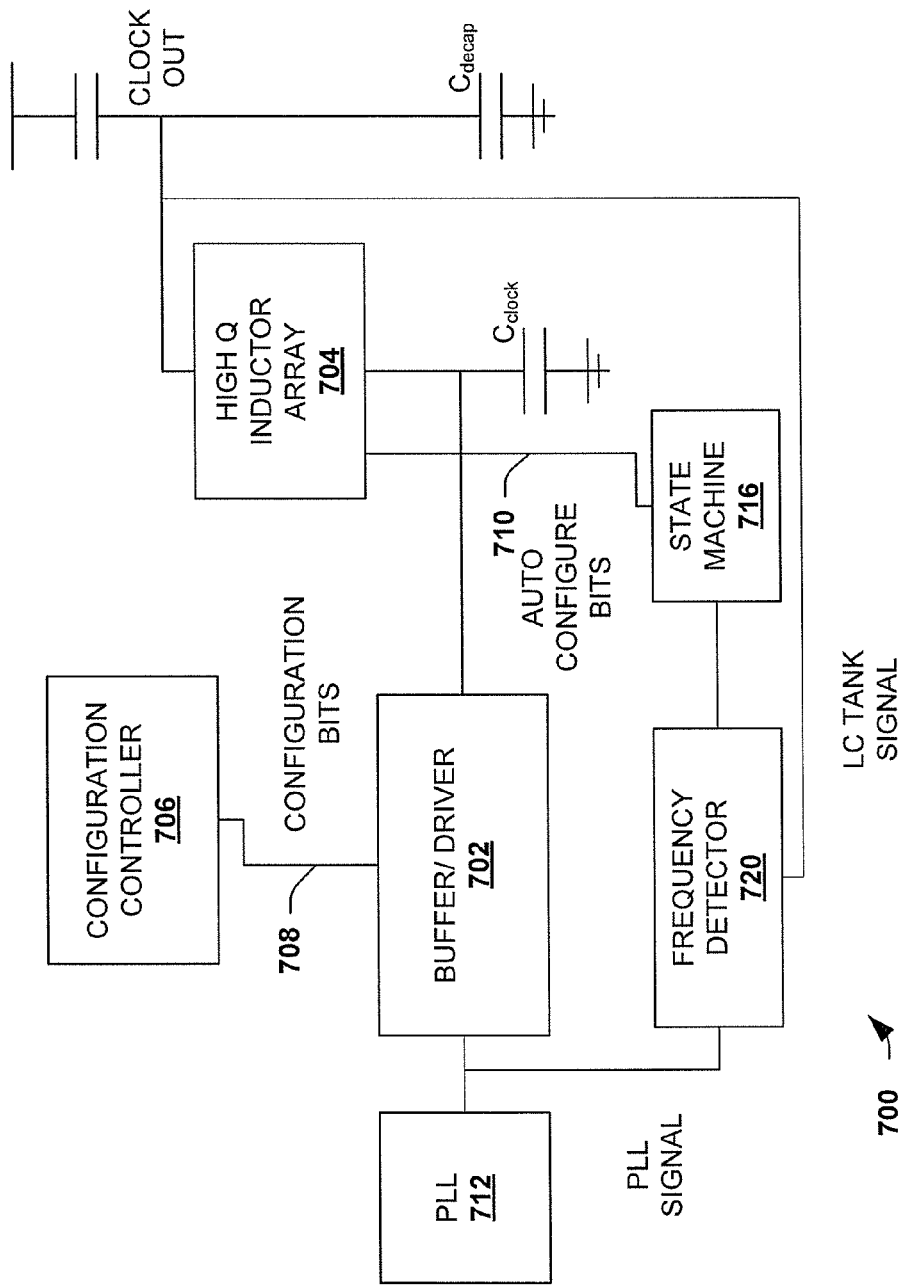
FIG. 7C is a block diagram illustrating another resonant clock circuit system implementation example in accordance with this disclosure.

FIG. 7C is a block diagram illustrating a resonant clock circuit system 700 in accordance with this disclosure. The system 700 utilizes frequency detection to detect frequencies and adjust an inductor array as needed.

The resonant clock system 700 includes components similar to those used in the system 300 described above and in FIG. 7A. The corresponding description for the similar named components can be referenced.

The resonant clock system 700 includes a buffer/driver 702, a high Q factor inductor array 704, a configuration controller 706, a phase locked loop (PLL) 712, a frequency detector 720 and a state machine 716. The driver component 702 includes a plurality of drivers having varied sizes.

The inductor array 704 includes an array of selectable high Q factor inductors. The inductor array 704 provides a selected high Q inductance according to inductor configuration bits 710. The inductor array 704 receives the auto configuration bits and the driven signal and provides a resonant clock output signal, also referred to as an LC tank signal, at the selected frequency. The inductor array 704 includes in array of selectable inductors aligned in serial and/or parallel configurations. The total amount of inductance provided by the inductor array 704 results in an LC tank oscillation frequency that corresponds to the selected frequency.

The configuration controller 706 provides the driver configuration bits 708 to the driver component 702. In one example, the configuration controller 706 generates the driver configuration bits 708 according to the current, selected frequency.

The frequency detector 720 receives the PLL signal and the LC tank signal and generates a frequency detection signal there from. The frequency detection signal indicates frequencies of the PLL signal and the LC tank signal.

The state machine 716 receives the frequency detection signal and provides the auto configure bits/signal to the inductor array 704. The state machine 716 has a plurality of states associated with selectable frequencies of the system 700. The state machine 716 selects one of the states according to the frequency detection signal and provides the auto configuration bits associated with the selected state.

As a result, the system 700 can adjust or compensate the inductance value of the array 704 automatically. Thus, the resonant clock signal frequency produced by the inductance value from the high-Q inductor array and the clock load $C_{clock}$ will be identical to the PLL signal frequency in the system 700.

Figure 8:
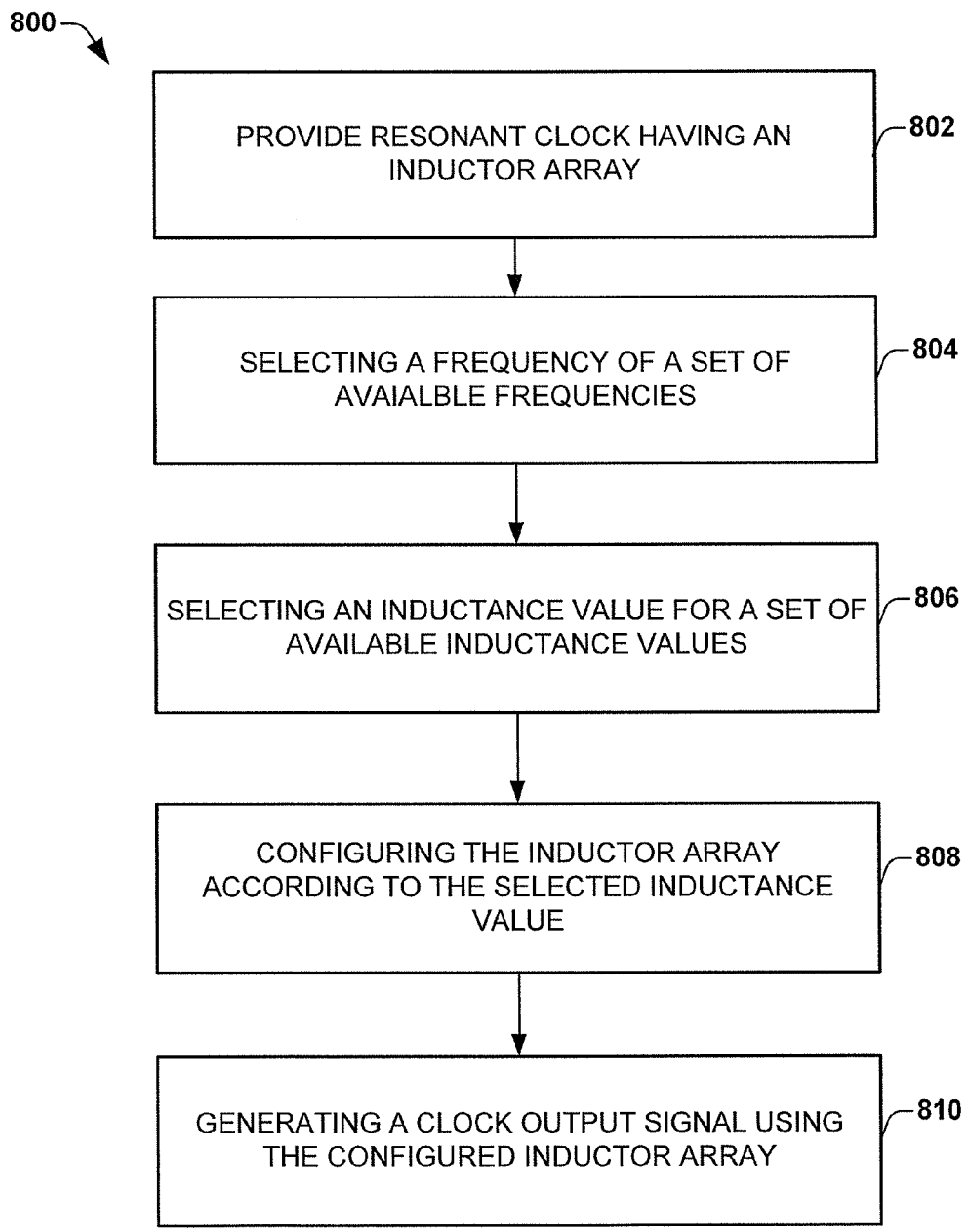
FIG. 8 is a flow diagram illustrating a method of operating a resonant clock circuit in accordance with this disclosure.

FIG. 8 is a flow diagram illustrating a method 800 of operating a resonant clock circuit in accordance with this disclosure. The method 800 utilizes a selectable, high Q factor array of inductors to provide a resonant clock output signal at a selected frequency and relatively low power consumption.

The method 800 begins at block 802, wherein a resonant clock circuit having an inductor array is provided. The resonant clock circuit includes an LC tank comprised of a clock load capacitor and the inductor array.

A frequency is selected from a set of available frequencies for the circuit at block 804. The set of available frequencies is determined by implementation. The frequency can be selected according to factors or modes of operation. For example, a lower frequency is selected for a low power mode. In another example, a higher frequency is selected for a normal mode or high performance mode of operation.

An inductance value is selected from a set of available inductance values at block 806. The set of available inductance values corresponds to the set of available frequencies. Thus, each inductance value results in a resonant frequency equal to one of the available frequencies. The inductance value is selected according to the selected frequency.

The inductor array is configured according to the selected inductance value at block 808. Individual inductors of the array are selectively added or removed from an effective inductor such that the inductor array provides the selected inductance value. In one example, switches are associated with each inductor of the array and control bits are utilized to selectively add or remove the individual inductors.

An LC resonant clock output signal is generated at block 810 using the configured inductor array at block 810 with resonant frequency corresponding to a selected (PLL or clock) frequency. The LC tank of the circuit is composed of a clock load capacitance and the selected inductance value. The LC tank then mitigates power loss at the selected frequency.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular switch type, it will be appreciated that alternative switch types may be utilized as will be appreciated by one of ordinary skill in the art.

The present disclosure includes a resonant clock system having a driver component, a clock load capacitor, and an inductor array. The driver component generates a driven input signal. The clock load capacitor is configured to receive the driven input signal. The inductor array is configured to have an effective inductance according to a selected frequency. The inductor array also generates a resonant signal with the clock load capacitance at the selected frequency using the effective inductance. The selected frequency is one of a plurality of available frequencies for the clock system.

The present disclosure also includes another resonant clock system. The resonant clock system includes a PLL, a driver component, an inductor array, and an inductor configuration component. The PLL is configured to generate a PLL signal. The driver component is configured to provide a driven signal from the PLL signal. The inductor array includes an array of high Q factor inductors. The inductor array is configured to receive the driven signal and to provide a resonant signal according to inductor configuration information. The inductor configuration component provides the inductor configuration information according to the PLL signal and the resonant clock output signal.

The present disclosure includes a method of operating a resonant clock circuit. A resonant clock circuit having an inductor array is provided. A frequency is selected from a plurality of available frequencies. An inductance value is selected from a plurality of inductance values according to the selected frequency. The inductor array is configured according to the selected inductance value. A resonant clock output signal is generated using the configured inductor array and at the selected frequency.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A resonant clock system comprising:
a driver component configured to generate a driven input signal, wherein the driver component includes a plurality of drivers having varied sizes;
a clock load capacitor configured to receive the driven input signal;
an inductor array configured to have an effective inductance according to a selected frequency and to generate a resonant clock output signal at the selected frequency; and
a configuration controller configured to provide inductor configuration information to the inductor array and provide driver configuration information to the driver component, wherein the driver configuration information is configured to continuously enable a first power level from a first driver while continuously disabling power from a second driver throughout provision of a first selected frequency.

2. The system of claim 1, wherein the selected frequency is one of a plurality of available frequencies.

3. The system of claim 2, wherein the effective inductance is one of a plurality of available effective inductances.

4. The system of claim 1, wherein the driver component includes a plurality of drivers of varied sizes and the driver component is configured to utilize one of the plurality of drivers according to the selected frequency.

5. The system of claim 1, wherein the driver component is configured to receive a phase locked loop (PLL) signal as an input signal.

6. The system of claim 1, wherein the effective inductance has an inductive reactance equal to a capacitive reactance of the clock capacitor at the selected frequency.

7. The system of claim 1, wherein the inductor configuration information corresponding to a new selected frequency.

8. The system of claim 1, wherein the inductor array includes a plurality of inductors.

9. The system of claim 8, wherein the inductor array further includes switches coupled to the inductors, the switched configured to operate according to inductor configuration information.

10. The system of claim 8, wherein the plurality of inductors are connected in series.

11. The system of claim 8, wherein the plurality of inductors are connected in parallel.

12. The system of claim 1, wherein the driver configuration information is further configured to continuously enable a second power level from the second driver while continuously disabling the first driver throughout provision of a second selected frequency.

13. The system of claim 12, wherein the first driver has a first size that is greater than a second size of the second driver, the first power level is greater than the second power level, and the first frequency is greater than the second frequency.

14. A resonant clock system comprising:
a driver component configured to generate a driven input signal;
a clock load capacitor configured to receive the driven input signal;
an inductor array configured to have an effective inductance according to a selected frequency and to generate a resonant signal at the selected frequency; and
an inductor configuration component configured to automatically generate and provide inductor configuration information to the inductor array, the inductor configuration information generated according to the resonant signal and a PLL signal.

15. The system of claim 14, wherein the inductor configuration component includes a frequency comparator configured to receive the PLL signal and the resonant signal and a state machine configured to generate the inductor configuration information according to an output signal of the frequency comparator.

16. A resonant clock system comprising:
a PLL configured to generate a PLL signal;
a driver component configured to receive the PLL signal and to provide a driven signal;
an inductor array configured to receive the driven signal and to provide a resonant signal; and
an inductor configuration component configured to provide inductor configuration information to the inductor array according to the PLL signal;
wherein the inductor configuration component includes a frequency detector to detect frequencies of the PLL signal and the resonant signal.

17. A resonant clock system comprising:
a PLL configured to generate a PLL signal;
a driver component configured to receive the PLL signal and to provide a driven signal;
an inductor array configured to receive the driven signal and to provide a resonant signal; and
an inductor configuration component configured to provide inductor configuration information to the inductor array according to the PLL signal;
wherein the inductor configuration component includes a PLL counter and a resonant signal counter, wherein the PLL counter counts cycles of the PLL signal and the resonant signal counter counts cycles of the resonant signal in a selected time interval.

* * * * *